(12) United States Patent
Kwon

(10) Patent No.: US 8,110,461 B2
(45) Date of Patent: Feb. 7, 2012

(54) FLASH MEMORY DEVICE AND MANUFACTURING METHOD OF THE SAME

(75) Inventor: Young Jun Kwon, Chungbuk (KR)

(73) Assignee: Dongbu Hitek Co., Ltd., Seoul (KR)

( * ) Notice: Subject to any disclaimer, the term of this patent is extended or adjusted under 35 U.S.C. 154(b) by 143 days.

(21) Appl. No.: 12/641,432

(22) Filed: Dec. 18, 2009

(65) Prior Publication Data

US 2010/0163966 A1 Jul. 1, 2010

(30) Foreign Application Priority Data

Dec. 31, 2008 (KR) .................. 10-2008-0138887

(51) Int. Cl.
*H01L 21/8238* (2006.01)
(52) U.S. Cl. .. 438/201; 438/211; 438/257; 257/E21.179
(58) Field of Classification Search ............... 438/201, 438/211, 257, 593; 257/E21.179, E21.422, 257/E21.68
See application file for complete search history.

(56) References Cited

U.S. PATENT DOCUMENTS 7,718,488 B2 * 5/2010 Chen et al. .................. 438/257

\* cited by examiner

*Primary Examiner* — Hoai V Pham
(74) *Attorney, Agent, or Firm* — Saliwanchik, Lloyd & Eisenschenk

(57) ABSTRACT

Disclosed are a flash memory device and a method for manufacturing the same. The flash memory device includes first and second memory gates on a substrate; a floating poly between the first and second memory gates; first and second select gates at respective outer sides of the first and second memory gates; an oxide layer between the first memory gate and the first select gate and between the second memory gate and the second select gate; a drain region in the substrate at outer sides of the first and second select gates; a source region in the substrate between the first and second memory gates; and a metal contact on each of the drain region and the source region.

6 Claims, 7 Drawing Sheets

FLASH MEMORY DEVICE AND MANUFACTURING METHOD OF THE SAME

CROSS-REFERENCE TO RELATED APPLICATION

This application claims the benefit under 35 U.S.C. §119 of Korean Patent Application No. 10-2008-0138887, filed Dec. 31, 2008, which is hereby incorporated by reference in its entirety.

BACKGROUND

A flash memory device is a nonvolatile memory device that does not lose data stored therein even if power is turned off. In addition, the flash memory can record, read, and delete data at a relatively high speed.

Accordingly, the flash memory device is widely used for the Bios of a personal computer (PC), a set-top box, a printer, and a network server in order to store data. Recently, the flash memory device is extensively used for digital cameras and portable phones.

In such a flash memory device, a semiconductor device having a SONOS (Silicon-Oxide-Nitride-Oxide-Silicon) structure is often used.

Different from a flash memory device having a floating gate including polycrystalline silicon, the SONOS memory device is a charge-trap type device, in which gate voltage is applied so that charges (electrons) pass through a thin oxide layer formed on silicon to become injected into or released from a charge trap formed in a silicon nitride layer.

FIGS. 1A to 1C are sectional views showing the procedure for manufacturing flash memory devices according to related art.

As shown in FIG. 1A, when a split select gate is defined by a photo and etch process, select gate lengths of cells may be different from each other (L1≠L2) due to an overlay misalign in the photo process, so one cell (A-Cell shown on the left) may have characteristics different from characteristics of the other cell (B-Cell shown in the right).

In addition, as shown in FIG. 1B, when the split select gate is defined by the photo and etch process in a state in which a local nitride layer is used as a memory site, the cells may have various nitride lengths (L3≠L4) and select gate lengths (L1≠L2) due to the critical dimension CD variation and over-lay misalign in the photo process, so that characteristic variation of the left cell (A-Cell) and the right cell (B-Cell) may be increased.

Further, referring to FIG. 1C, it can be difficult to remove polysilicon covering a source region between adjacent cells without damage when forming an active gate poly and a memory gate poly.

BRIEF SUMMARY

An embodiment provides a flash memory device having a self-align SONOS structure and a method for manufacturing the same, in which a self-align double spacer process is used instead of the photo and etch process to form a cell. According to embodiments, problems related to the CD and overlay variation can be minimized, thereby achieving cell uniformity while inhibiting degradation of characteristics.

In addition, an embodiment provides a flash memory device and a method for manufacturing the same, in which an area of a source side can be enlarged and a spacer poly forming process is performed after implanting source ions, so that time and labor force required for removing a gap-fill poly without active damage can be saved. In this case, the LDD length can be increased proportionally to the thickness of polysilicon used for the spacer poly, so that punch-through breakdown voltage (BV) between the source and the drain may rise during the program and erase operations.

A flash memory device according to an embodiment includes first and second memory gates on a substrate; a floating poly between the first and second memory gates; first and second select gates at respective outer sides of the first and second memory gates; an oxide layer between the first memory gate and the first select gate and between the second memory gate and the second select gate; a drain region in the substrate at outer sides of the first and second select gates; a source region in the substrate between the first and second memory gates; and a metal contact on each of the drain region and the source region.

A method for manufacturing a flash memory device according to an embodiment includes forming first and second memory gates on a substrate; forming an oxide layer on an entire surface of the substrate formed with the first and second memory gates; forming a floating poly between the first and second memory gates; forming first and second select gates at outer sides of the first and second memory gates; forming a drain region in the substrate at outer sides of the first and second select gates; forming a source region in the substrate between the first and second memory gates; and forming a metal contact on each of the drain region and the source region.

DETAILED DESCRIPTION

Hereinafter, embodiments of a flash memory device and a method for manufacturing the same will be described with reference to accompanying drawings.

In the description of embodiments, it will be understood that when a layer (or film) is referred to as being 'on' another layer or substrate, it can be directly on another layer or substrate, or intervening layers may also be present. Further, it will be understood that when a layer is referred to as being 'under' another layer, it can be directly under another layer, or one or more intervening layers may also be present. In addition, it will also be understood that when a layer is referred to as being 'between' two layers, it can be the only layer between the two layers, or one or more intervening layers may also be present.

Figure 1A:
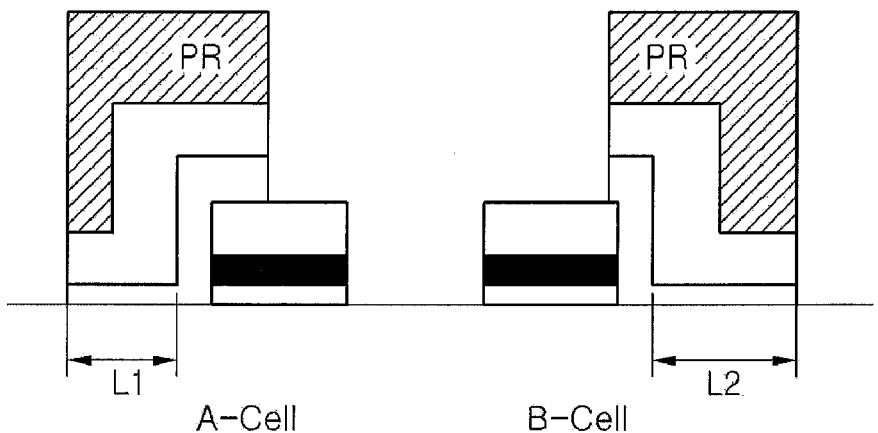
FIGS. 1A to 1C are cross-sectional views showing the procedure for manufacturing a flash memory device according to related art.
Figure 1B:
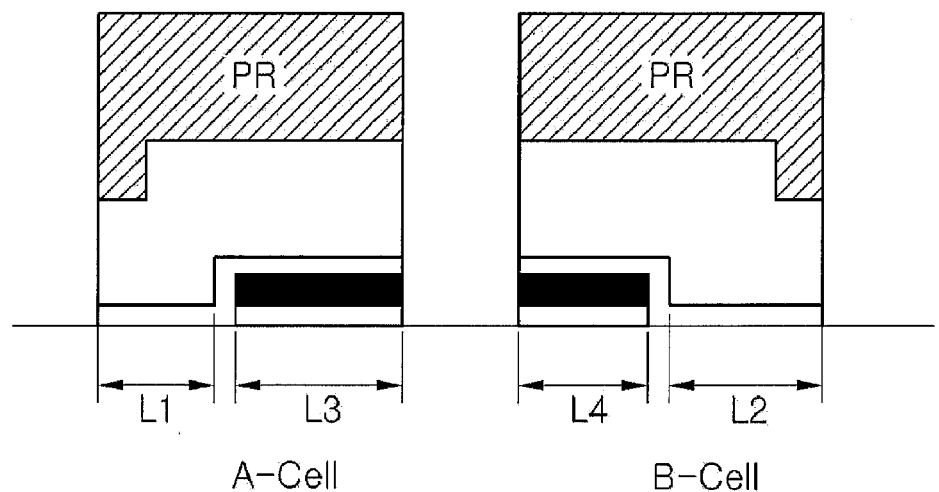
Figure 1C:
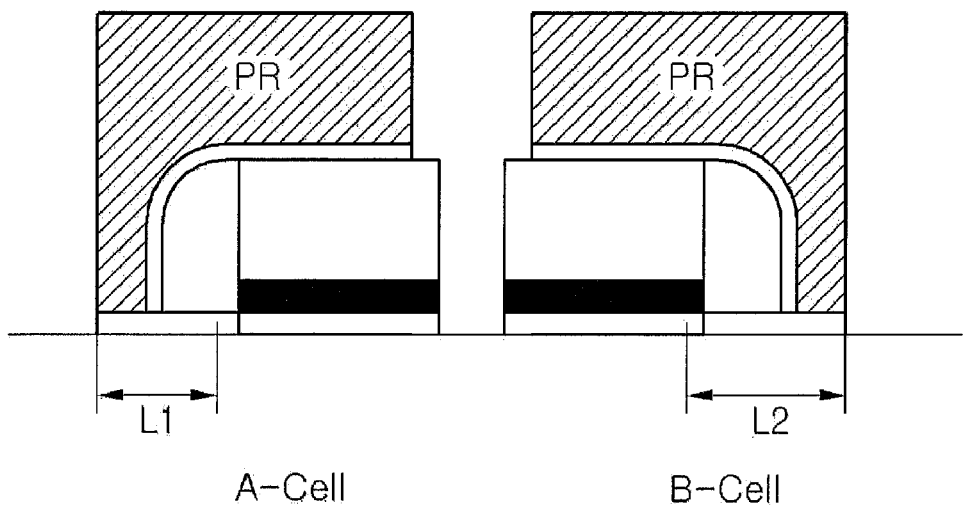
Figure 2:
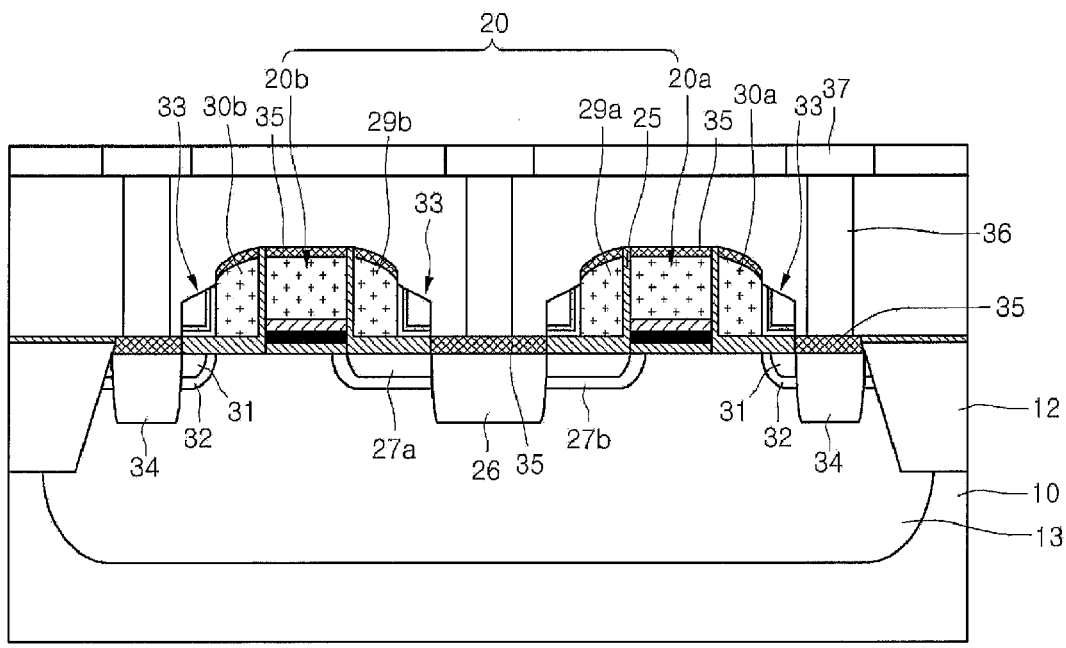
FIG. 2 is a cross-sectional view of a flash memory device according to an embodiment.

FIG. 2 is a cross-sectional view of a flash memory device according to an embodiment.

Referring to FIG. 2, flash memory device according to an embodiment includes first and second memory gates 20a and 20b on a substrate 10; floating polys 29a and 29b between the first and second memory gates 20a and 20b; first and second select gates 30a and 30b at outer sides of the first and second memory gates 20a and 20b, respectively; a third oxide layer 25 between the first memory gate 20a and the first select gate 30a and between the second memory gate 20b and the second select gate 30b; a drain region formed on the substrate 10 at outer sides of the first and second select gates 30a and 30b; a source region formed on the substrate 10 between the first and second memory gates 20a and 20b; and a metal contact 36 on each of the drain region and the source region. Reference numerals shown in FIG. 2, but not described, will be explained when a manufacturing method for the flash memory device is described.

According to the flash memory device and the method for manufacturing the same of an embodiment, a polysilicon forming process and an etching process of the polysilicon are performed after implanting source ions. Therefore, there is no need to remove polysilicon covering a source region in order to form the source region, and time and labor force required for removing the poly of the source region without damage can be saved. In addition, the manufacturing process is simplified and the manufacturing time is shortened, so that the manufacturing cost can be reduced.

According to an embodiment, a high bias is applied to the source of a selected cell during program and erase operations. By utilizing the poly and source region formation processes according to an embodiment, the polysilicon is used to block N+ ions when the N+ ion implantation process is performed, so that an LDD drift area of the source region of the cell is enlarged, thereby improving the punch-through BV between the source and the drain. Accordingly, when the program and erase operations of the cell are performed, the punch-through BV of the source receiving high bias is improved, so that the punch-through BV between the source and the drain can be improved without increasing the length of the cell.

Further, the memory cells of SONOS structures show characteristics sensitive to lengths of the nitride layer and the select gate. In a related art, photo and etch processes are performed to control the lengths of the nitride layer and the select gate. In contrast, embodiments of the invention can address the problems related to the CD and overlay variation found in the related art by employing a self-align scheme, resulting in superior characteristics in terms of uniformity of cell characteristics.

Hereinafter, a method for manufacturing the flash memory device according to an embodiment will be described with reference to FIGS. 3 to 14.

Figure 3:
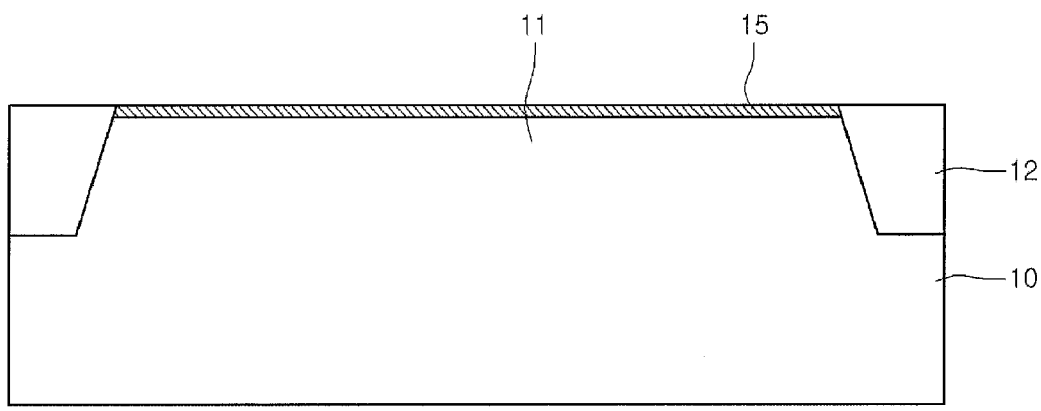
FIGS. 3 to 14 are cross-sectional views showing the procedure for manufacturing a flash memory device according to the embodiment.

First, as shown in FIG. 3, an isolation layer 12 is formed on a substrate 10 to define an active area 11. At this time, a pad oxide layer 15 can be formed on the active area.

Figure 4:
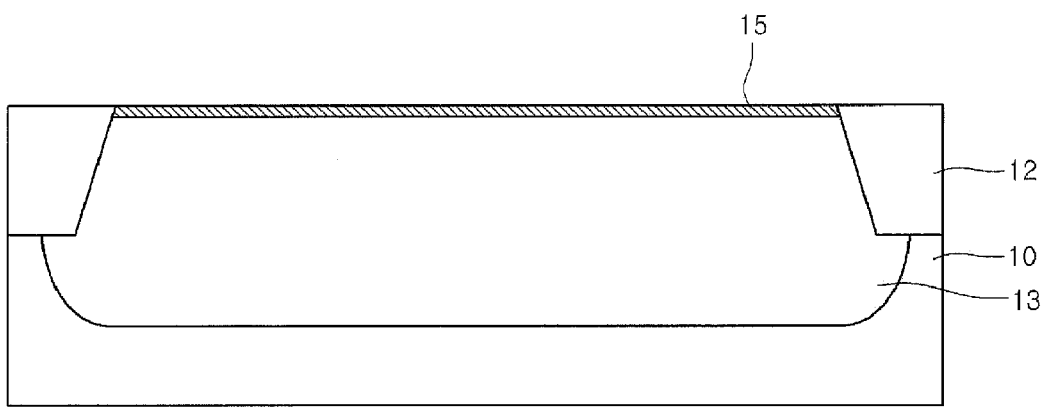

Then, as shown in FIG. 4, a first ion implantation process is performed on the substrate 10 to form a well area 13. For the memory cell area, well area 13 can be P type where the memory gates are to be formed. In an embodiment, if the substrate 10 is a P type substrate, N type ions are implanted to form an N type well, and the regions where the memory gates are formed can be formed without a well 13 therebelow or be formed with a more highly P type region 13. According to an embodiment, a second ion implantation process is performed on the substrate 10 having the well area 13 to adjust threshold voltage.

Figure 5:
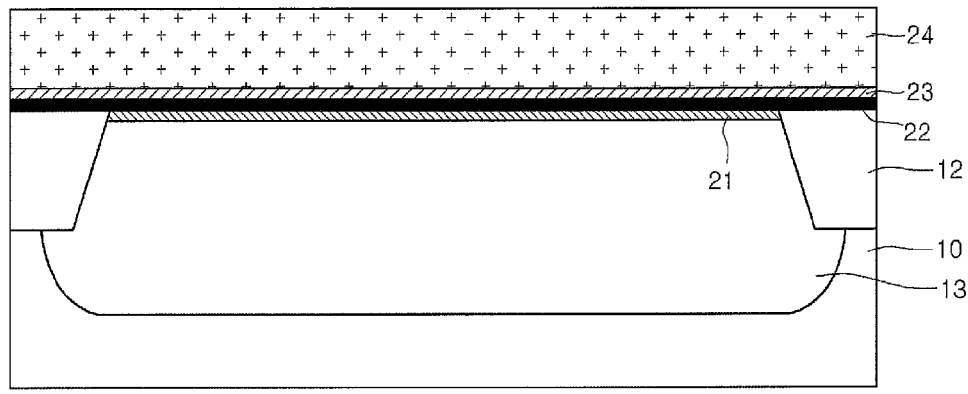

Next, as shown in FIG. 5, the pad oxide layer 15 is removed and a first oxide layer 21, a nitride layer 22, a second oxide layer 23, and a first polysilicon layer 24 are sequentially formed on the substrate 10.

For instance, the first oxide layer 21 may serve as a tunnel oxide layer. The first oxide layer 21 can include $SiO_2$, and can be formed on the substrate 10 at thickness of about 20 to 80 Å by performing the heat treatment process with respect to the substrate 10. In another embodiment, the first oxide layer 21 can include high-K material, such as $Al_2O_3$, and can be deposited on the substrate 10 through CVD (chemical vapor deposition) or ALD (atomic layer deposition).

The first nitride layer 22 may serve as a charge trap layer. The first nitride layer 22 can include $Si_xN_y$ (where x and y are natural numbers), and can be deposited on the first oxide layer 21 at thickness of about 70 to 100 Å through CVD.

The second oxide layer 23 may serve as a top oxide layer. The second oxide layer can include $SiO_2$, and can be deposited on the first nitride layer 22 through CVD, but the embodiment is not limited thereto.

The first polysilicon layer 24 can be deposited on the second oxide layer 23.

Figure 6:
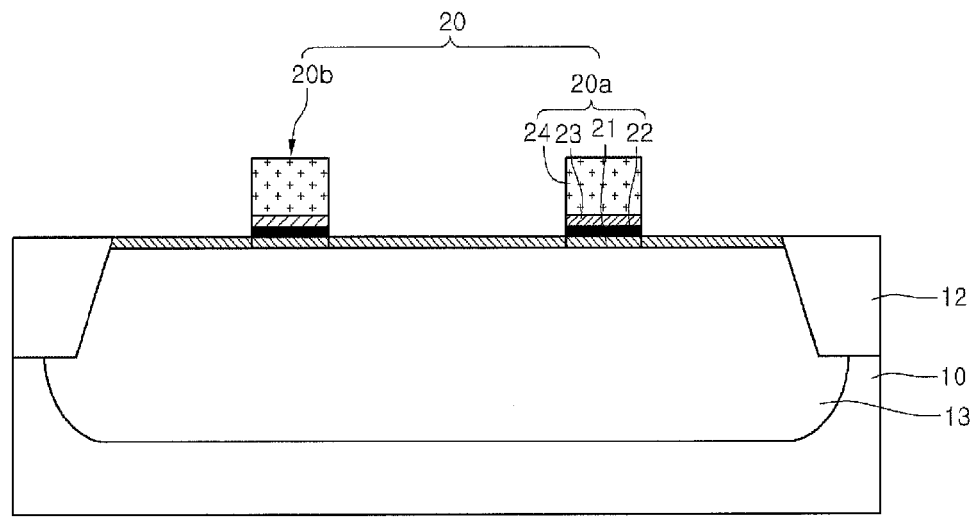

Then, as shown in FIG. 6, the first oxide layer 21, the first nitride layer 22, the second oxide layer 23, and the first polysilicon layer 24 are patterned to form a memory gate 20 including a first memory gate 20a and a second memory gate 20b. Thus, the memory gate 20 may have the SONOS structure.

For instance, after forming a first photoresist pattern (not shown) on the first polysilicon layer 24 such that parts of the first polysilicon layer 24 for the memory gate 20 are covered, the first polysilicon layer 24 is etched to define the memory gate 20. At this time, the etching process can be performed for a time to etch from the first polysilicon layer 24 to the first nitride layer 22. Otherwise, the etching process can be performed in two steps, in which the first polysilicon layer 24 is etched in the first step and the remaining layers are etched in the second step. In the case of the two-step etching process, the second oxide layer 23 serves as an etch stop layer in the first step, and the second oxide layer 23 and the first nitride layer 22 are etched in the second step. The second step can be performed through dry etching or wet etching.

Figure 7:
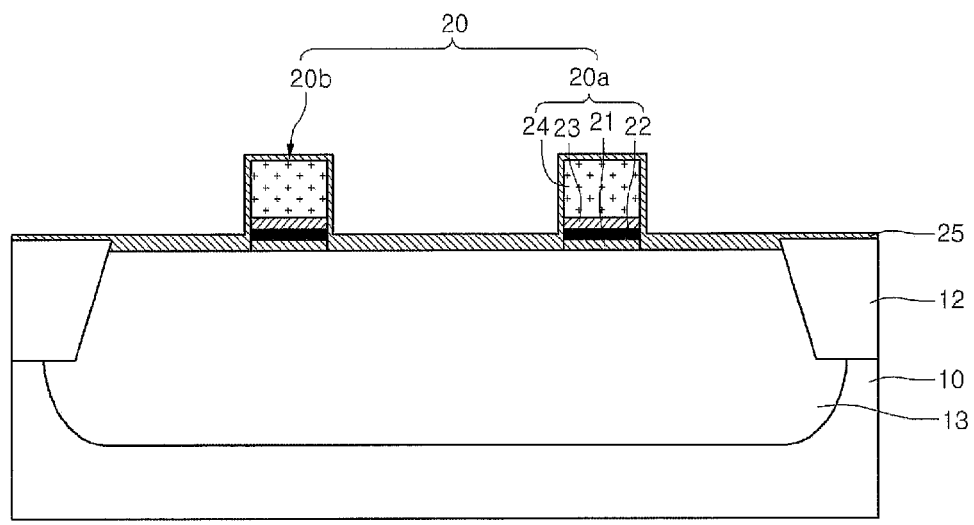

Then, as shown in FIG. 7, a third oxide layer 25 is formed over the entire surface of the substrate 10 formed with the first and second memory gates 20a and 20b.

In one embodiment, the first oxide layer 21 is removed from regions other than below the memory gates 20, and a thermal oxidation process, such as a dual gate oxidation process, is performed to form the third oxide layer 25.

The third oxide layer 25 may be an oxide layer including a thick gate oxide layer and a thin gate oxide layer, or may be a thin gate oxide layer itself.

Select gates 30a and 30b, which will be formed later, may use the third oxide layer 25 as the select gate oxide.

Figure 8:
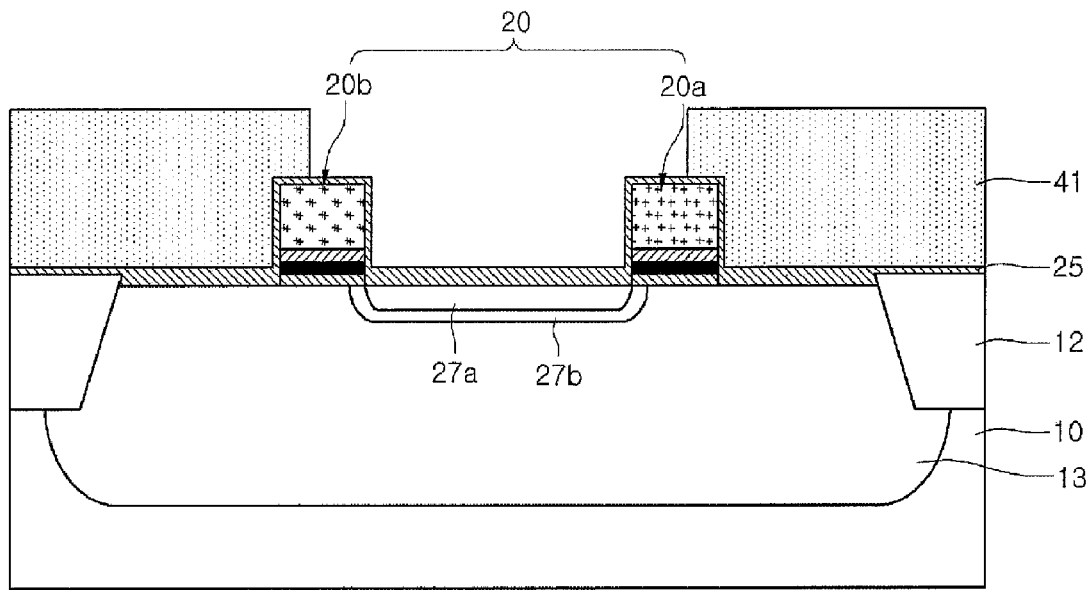

Then, as shown in FIG. 8, a halo ion implantation region 27b and a source LDD (lightly doped drain) ion implantation region 27a can be formed in the substrate 10 between the first and second memory gates 20a and 20b by using a first photoresist pattern 41 as a mask to improve HCI (hot carrier injection) efficiency.

Figure 9:
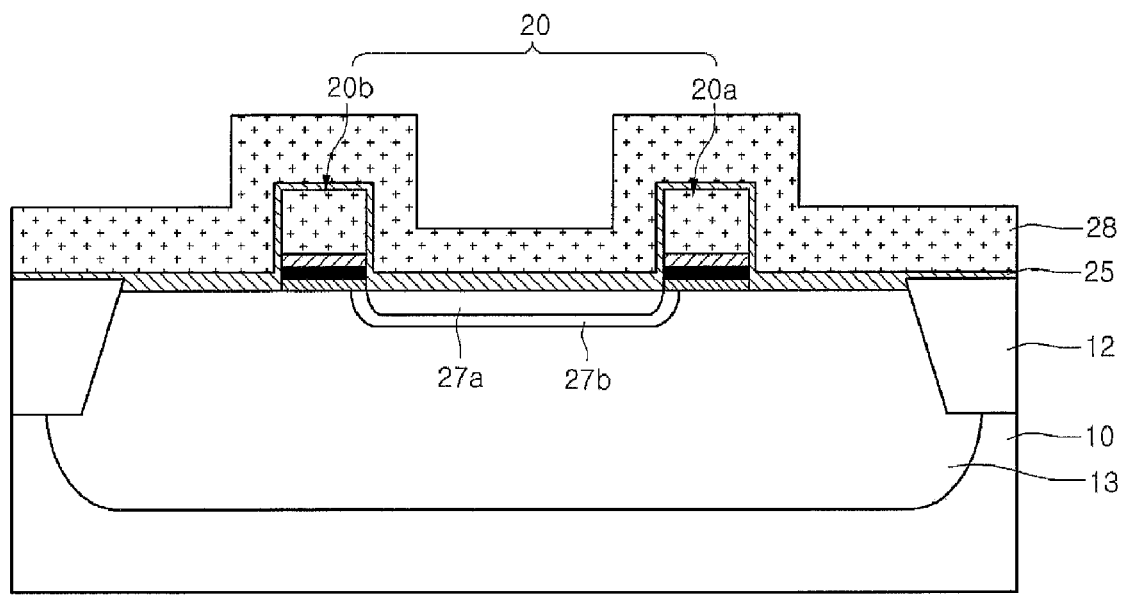

Next, as shown in FIG. 9, the first photoresist pattern 41 is removed, and a second polysilicon layer 28 is formed over the entire surface of the substrate 10 formed with a source LDD region 27a.

In one embodiment, the second polysilicon layer 28 is deposited just after the first photoresist pattern 41 has been removed.

Figure 10:
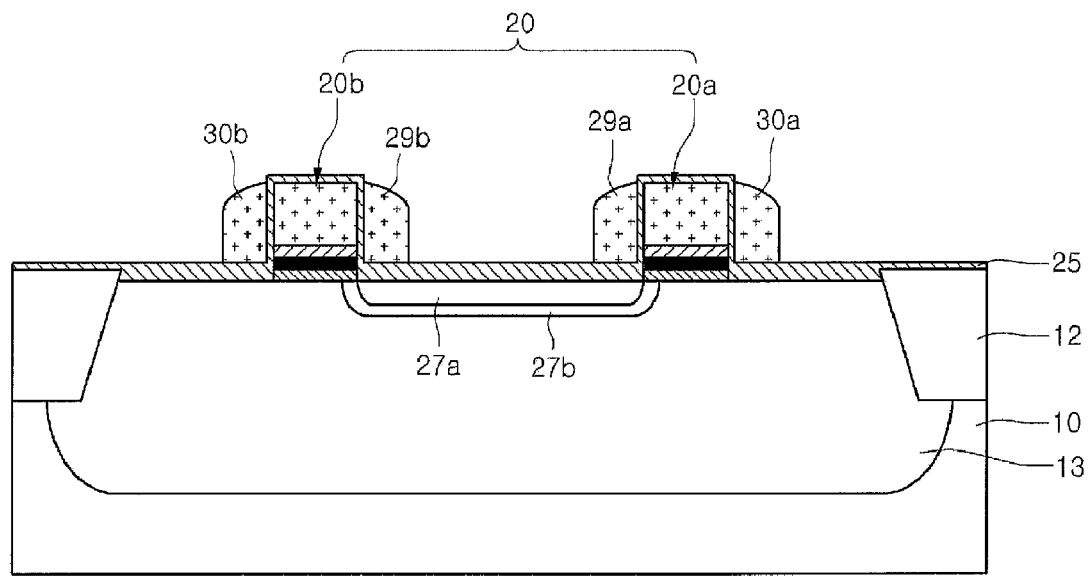

Then, as shown in FIG. 10, the second polysilicon layer 28 is etched to form first and second floating polys 29a and 29b between the first and second memory gates 20a and 20b, and to form first and second select gates 30a and 30b at outer sides of the first and second memory gates 20a and 20b. The floating polys and select gates can have a spacer shape.

In an embodiment, the entire surface of the cell area is subject to the polysilicon etching process. That is, an etch back process without an etch mask on the cell area can be performed. In this case, the length of the select gates 30a and 30b can be determined according to thickness of the second polysilicon layer 28. Therefore, the misalign problem of structures in the cell area can be minimized by forming the select gates through the self-align scheme.

In addition, according to an embodiment, since the ion implantation process has been already performed with respect to the source region and the LDD region, there is no need to remove the floating polys 29a and 29b in order to implant ions into the source region. Thus, the time and labor force required to remove the floating polys 29a and 29b without damage can be saved and the punch-through BV between the drain and the source can be improved.

According to an embodiment, when the select gate poly is defined, patterning and etching processes can be performed by using a photoresist pattern in the peripheral region (not shown), thereby defining the peripheral gate poly. In addition, if the active area is damaged during the etching process, the photo and etching process to define the select gate poly of the cell can be performed separately from the photo and etching process to define the peripheral gate poly.

Figure 11:
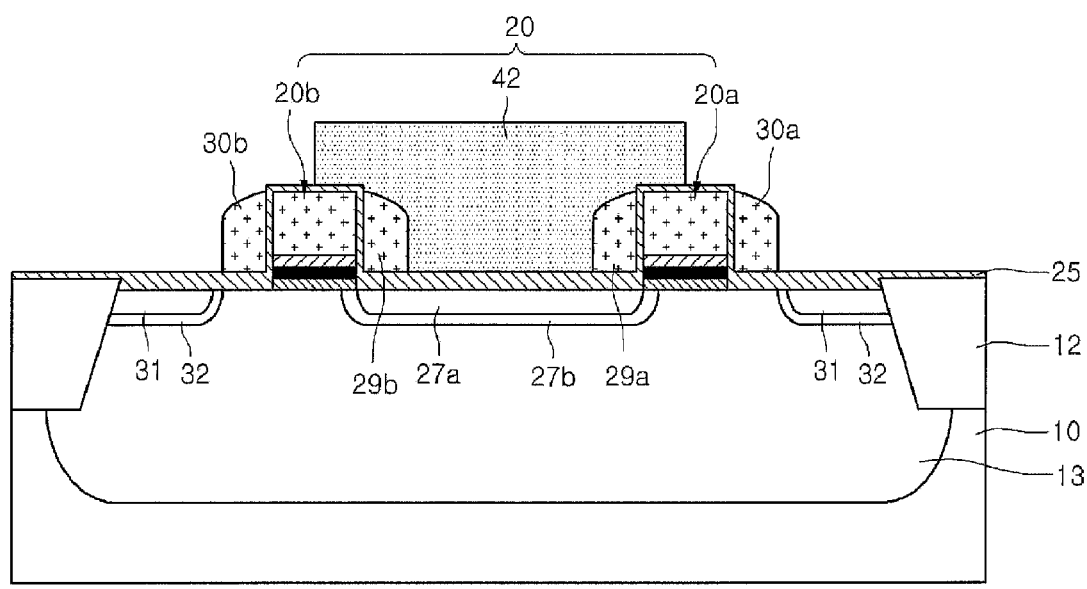

Referring to FIG. 11, a drain halo ion implantation region 32 and a drain LDD ion implantation region 31 are formed at the outer sides of the first and second select gates 30a and 30b by using a second photoresist layer pattern 42 as a mask.

According to an embodiment, the drain LDD ion implantation region 31 can be formed when the LDD ion implantation process is performed for a transistor provided in the peripheral region.

Figure 12:
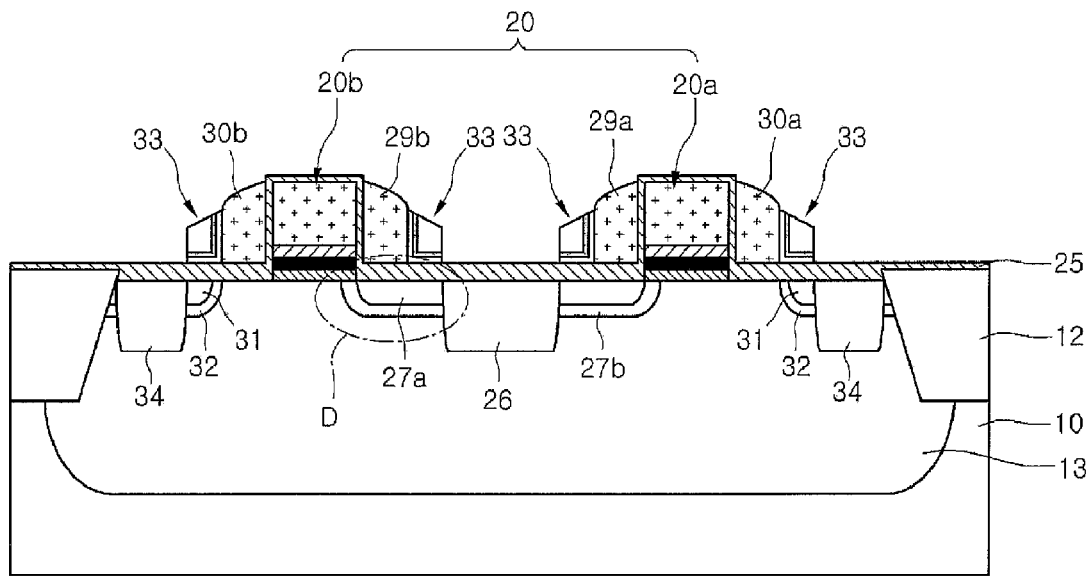

Then, as shown in FIG. 12, after removing the second photoresist layer pattern 42, a drain region 34 is formed on the substrate 10 at the outer sides of the first and second select gates 30a and 30b and a source region 26 is formed on the substrate 10 between the first and second memory gates 20a and 20b through an ion implantation process.

In an embodiment, a spacer 33 is formed, and an ion implantation process is performed using N+ ions at high concentration to form a source region 26 and a drain region 34. The spacer 33 may have an ONO (Oxide-Nitride-Oxide) structure or an ON (Oxide-Nitride) structure.

According to an embodiment, the ion implantation process for the drain region and the source region can be performed simultaneously with the ion implantation process for the source and the drain of the transistor provided in the peripheral region.

According to an embodiment, the floating poly of the source region may block the N+ ions when the ion implantation process is performed for the source and the drain, so that the LDD drift area D can be enlarged, thereby improving the punch-through BV between the source and the drain.

Figure 13:
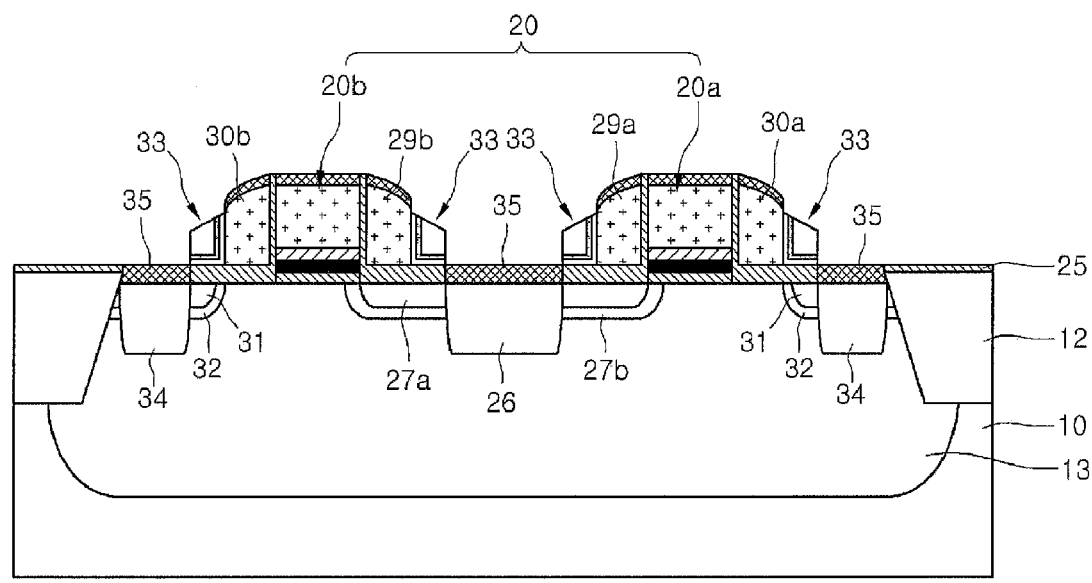

Then, as shown in FIG. 13, a salicide process is performed. For example, after removing the third oxide layer 25 from exposed surfaces of the source region 26, the drain region 34, the memory gate 20, and the floating polys 29a and 29b, a metal layer, such as a cobalt (Co) layer, is formed on the entire surface of the substrate 10. Then, salicide layers 35 are formed on the source region 26, the drain region 34, the select gates 30a and 30b, the memory gate 20, and the floating polys 29a and 29b through a heat treatment process with respect to the metal layer.

Figure 14:
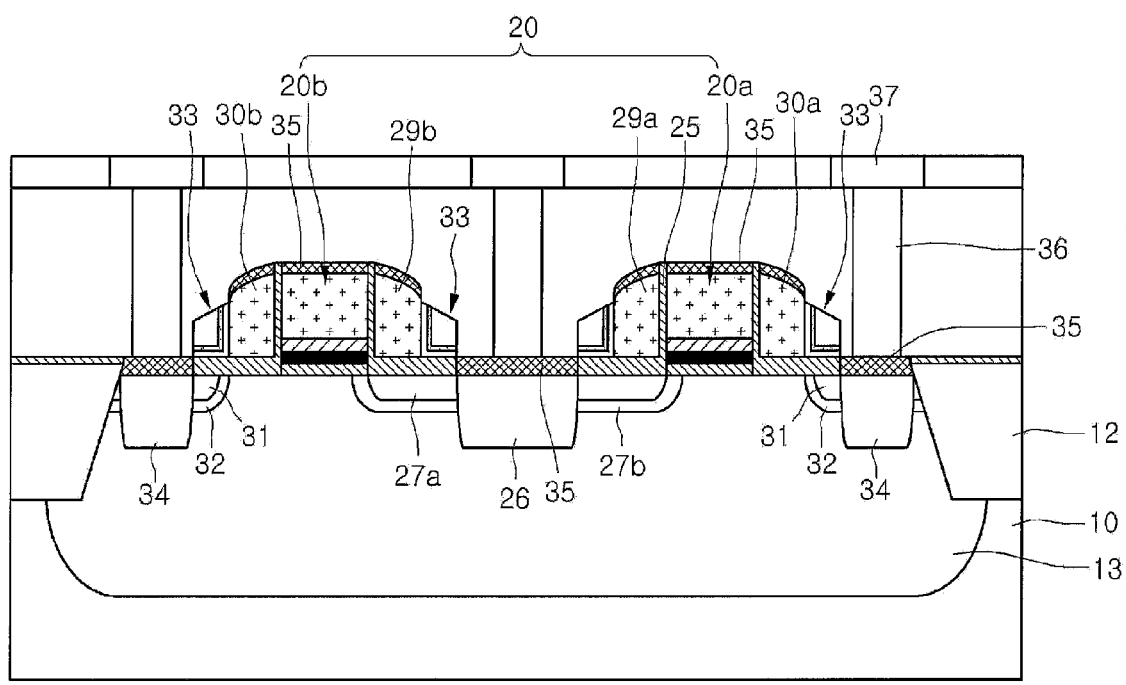

Next, as shown in FIG. 14, a back end process is performed to form metal contacts 36 and metal lines 37 on the source region 26 and the drain region 34.

According to the flash memory device and the method for manufacturing the same of an embodiment, since the poly forming process and the etching process are performed after implanting source ions, there is no need to remove poly disposed on the source region, so time and labor force required for removing the poly on the source region without damage can be saved. In addition, the manufacturing process is simplified and the manufacturing time is shortened, so that the manufacturing cost can be reduced.

In addition, a high bias can be applied to the source of the cell during the program and erase operations. According to an embodiment, the poly on the source region blocks N+ ions when the N+ ion implantation process for forming the source and drain regions is performed, so that an LDD drift area of the source region of the cell is enlarged, thereby improving the punch-through BV between the source and the drain. Accordingly, when the program and erase operations of the cell are performed, the punch-through BV of the source receiving high bias is improved, so that the punch-through BV between the source and the drain can be improved without increasing the length of the cell.

Further, the memory cells show characteristics sensitive to lengths of the nitride layer and the select gate. According to the related art, a photo and etch process is performed to control the lengths of the nitride layer and the select gate. In contrast, an embodiment can solve the problems related to the CD and overlay variation of the related art by employing a self-align scheme, resulting in superior characteristics in terms of uniformity of cell characteristics.

The flash memory device described above can be operated as follows, but the embodiment is not limited thereto.

The program operation of the flash memory device according to one embodiment can be achieved by applying bias for generating hot carrier electrons.

In addition, the erase operation can be achieved by forming EHP (electron-hole pair) while applying a bias that enables formation of band-to-band tunneling (BTBT). At this time, since the erase operation is performed in a unit of W/L (word line), cells aligned in the same word line of a selected cell are completely erased.

That is, the cells aligned in the same word line of the selected cell are erased even if the cells are unselected cells. In the read operation, current is applied according to bias applied to a drain region. Since the current applied during the program operation is different from the current applied during the erase operation, the program operation can be distinguished from the erase operation based on the current.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method for manufacturing a flash memory device, the method comprising:

forming first and second memory gates on a substrate;

forming a third oxide layer on an entire surface of the substrate formed with the first and second memory gates;

forming a source LDD region in the substrate between the first and second memory gates through an ion implantation process;

forming a second polysilicon layer on an entire surface of the substrate formed with the oxide layer;

etching the second polysilicon layer to form a floating poly on inner sidewalk of the first and second memory gates, respectively, and first and second select gates on respective outer sidewalls of the first and second memory gates;

forming a drain region in the substrate at outer sides of the first and second select gates;

forming a source region in the substrate between the first and second memory gates; and forming a metal contact on each of the drain region and the source region.

2. The method of claim 1, wherein the forming of the floating poly and the forming of the first and second select gates are simultaneously achieved by the etching of the second polysilicon layer.

3. The method of claim 2, wherein the etching of the second polysilicon layer forms the floating poly and the first and second select gates through a self-align scheme.

4. The method of claim 2, further comprising forming a peripheral gate poly simultaneously with the forming of the floating poly and the forming of the first and second select gates.

5. The method of claim 1, further comprising forming a source and drain of a transistor in a peripheral region simultaneously with an ion implantation process for forming the drain region at the outer sides of the first and second select gates.

6. The method of claim 1, wherein the forming of the first and second memory gates on the substrate includes:

sequentially forming a first oxide layer, a first nitride layer, a second oxide layer and a first polysilicon layer on the substrate; and patterning the first oxide layer, the first nitride layer, the second oxide layer and the first polysilicon layer to form the first and second memory gates adjacently disposed on the substrate.

\* \* \* \* \*